United States Patent [19]

Intrater et al.

[11] 4,186,684

[45] Feb. 5, 1980

[54] APPARATUS FOR VAPOR DEPOSITION OF MATERIALS

[76] Inventors: Joseph Intrater, 125 Demarest Ave., Englewood Cliffs, N.J. 07632; Ralph Gorman, 700 Columbus Ave., New York, N.Y. 10025

[21] Appl. No.: 802,469

[22] Filed: Jun. 1, 1977

[51] Int. Cl.² .............................................. C23C 13/08
[52] U.S. Cl. ..................................... 118/725; 118/724
[58] Field of Search .................. 118/48, 49.1, 49, 49.5

[56] References Cited

U.S. PATENT DOCUMENTS

| | | | |
|---|---|---|---|
| 3,460,510 | 8/1969 | Currin | 118/48 |
| 3,645,230 | 2/1972 | Hugle et al. | 118/49.5 |

*Primary Examiner*—Dorsey Newton

[57] ABSTRACT

An apparatus for performing vapor deposition processes on a substrate includes essential housing having a centrally located reaction chamber, with the housing having a pair of opposed openings in opposed sides thereof. Cover means are removably secured to the housing for closing the opening and they define coolant chambers therein. Reaction gases are supplied and exhausted from the reaction chamber through a ducting system, and the housing includes at least one additional coolant chamber therein about periphery of the reaction chamber between the cover plates. Coolant is supplied to and exhausted from the coolant chambers in order to cool the reaction chamber, and support means are provided in the reaction chamber supporting a substrate thereon upon which vapor deposition is to occur. Heat is supplied in the reaction chamber on the side of the support means opposite the substrate to heat the substrate.

6 Claims, 6 Drawing Figures

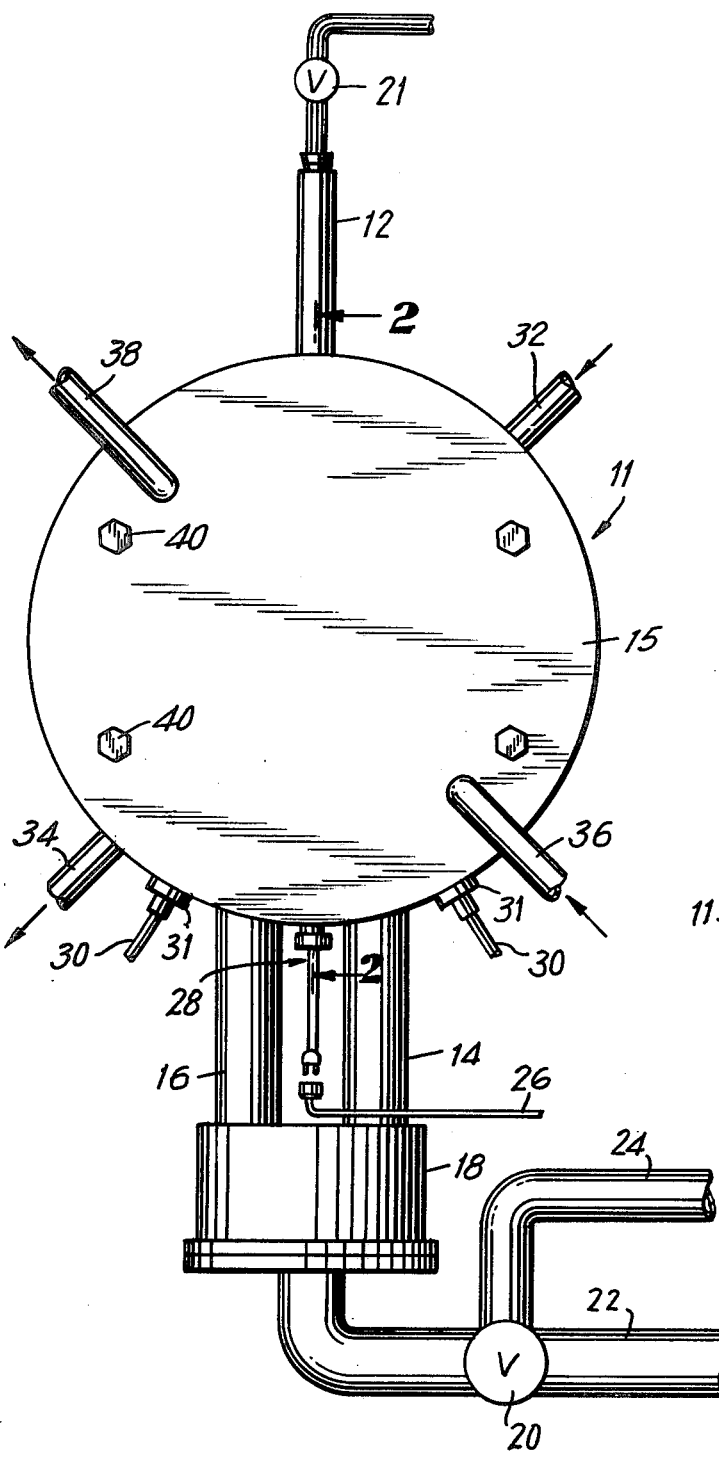
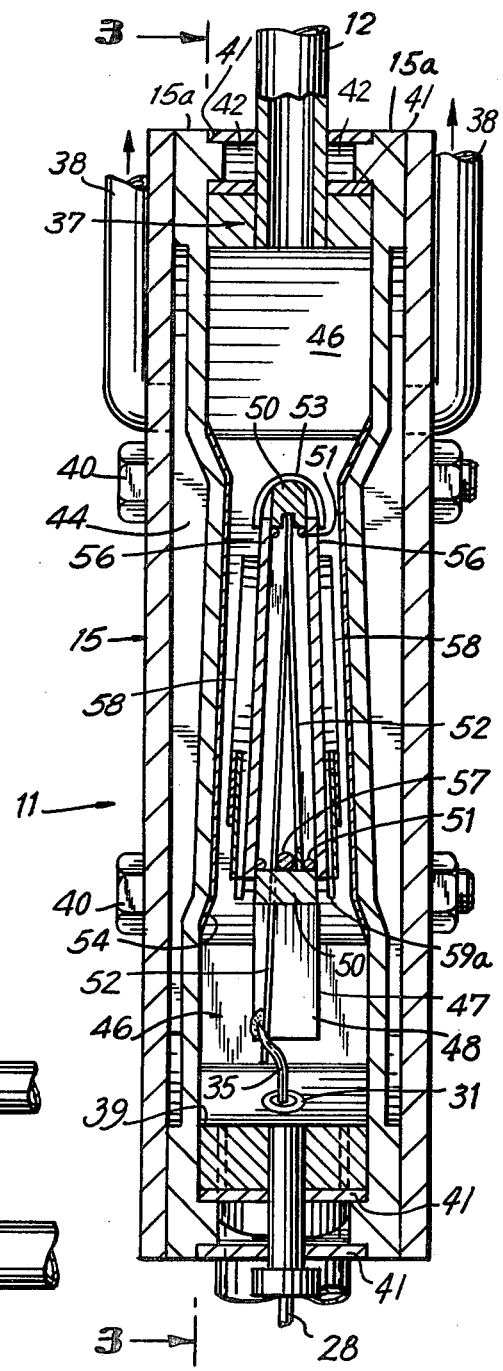

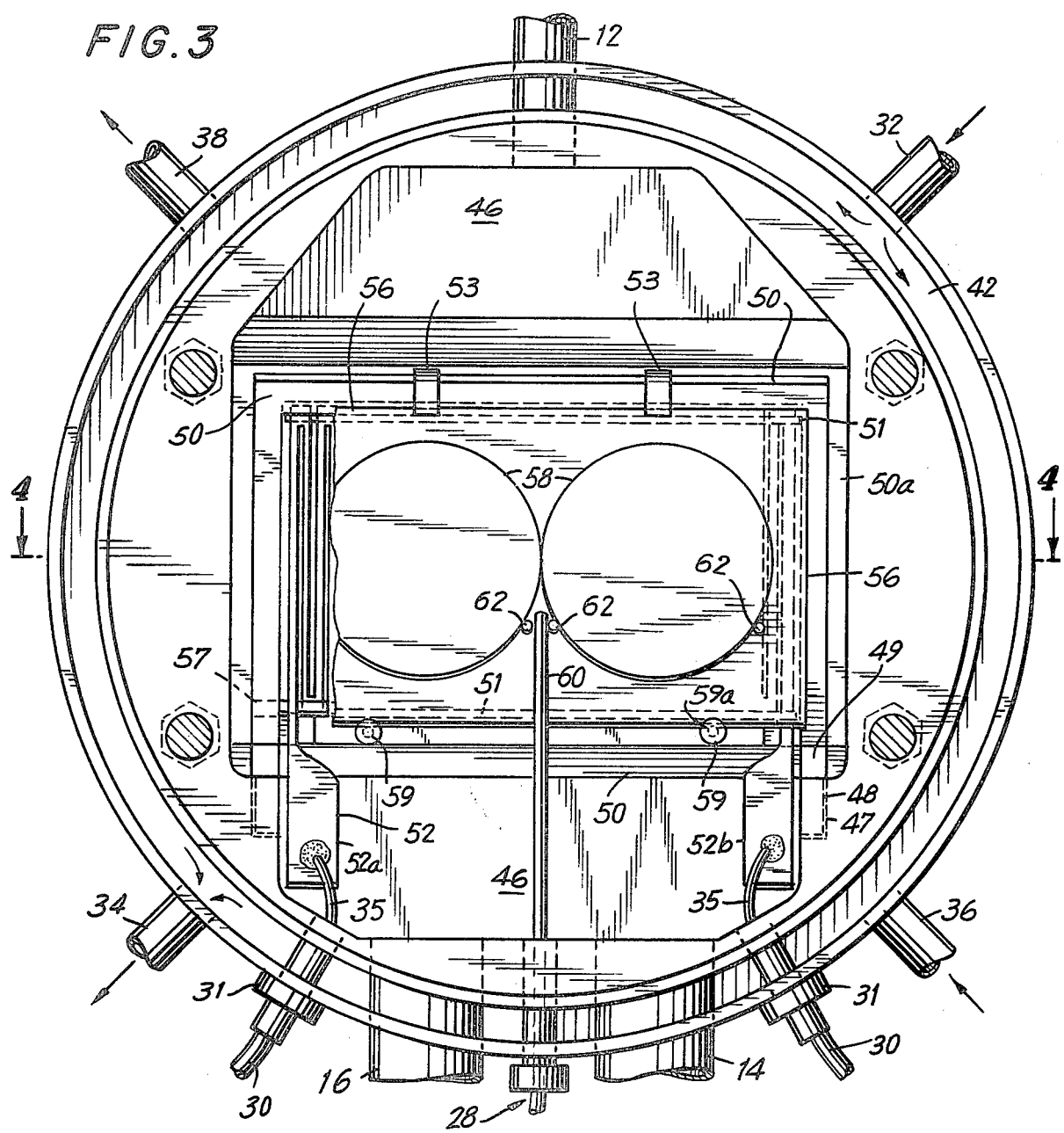

APPARATUS FOR VAPOR DEPOSITION OF MATERIALS

This invention pertains to an apparatus for depositing, by vapor deposition, various materials on an appropriate substrate. More particularly, this invention pertains, besides the apparatus, to a method to achieve this deposition in a more facile and economical manner. Still further, this invention pertains to a method for controlling more precisely the depositions sought to be achieved. Additionally, this invention pertains to vapor deposition of epitaxial or polycrystalline or other materials on exposed surfaces of articles such as silicon wafers or substrates commonly used for depositing vapor depositable materials.

As it is well known, gaseous chemical reactants, according to vapor deposition, are brought into contact with appropriately heated substrates placed on a susceptor material in a suitable reaction chamber. These substrates are supported on susceptor plates or frames which absorb the energy from a heat source, typically, either a radiant heater or via radio frequency heating, and a reaction takes place by decomposition such as when $SiCl_4$, $SiHCl_3$, $SiH_2Cl_2$, and $SiH_4$ are decomposed and deposited on suitable substrates to obtain an epitaxial deposit.

DESCRIPTION OF THE PRIOR ART

It is well known that when using radio frequency (R.F.) induction heating, a quartz reaction chamber is used with graphite being the susceptor. Generally, these are cold wall reaction systems. As is known, R.F. heating has many disadvantages which makes it increasingly harder to justify the use of this method. For example, a very costly R.F. generator is required, it must be located close to the film deposition reactor, and a tremendously high power input is required posing not only personal hazard, but a considerable heat input into an enclosed space in which the apparatus is used.

In order to achieve the desired uniformity in these R.F. heating units, various steps are taken to position the various substrates sought to be deposited on the susceptor such as by inclining the susceptor at a certain angle and using a tremendous amount of reactant and carrier gas (hydrogen) throughput per a given amount of silicon being deposited.

However, the quality control from the input end to the output end of the R.F. reactor still varies considerably despite all these precautions; and consistently high yields are often hard to achieve.

Inasmuch as the one piece electrically conducting susceptor must be heated, the induction type reactors normally require that the current flows therethrough such as to insure maximum efficiency. As it is well known that multiple susceptors cannot be used because electrical arcing would normally result, effective and efficient operative coupling of the R.F. generator to the susceptor is an absolute necessity. Hence, on an industrial scale, banks of units are being used aggravating still more the heat dissipation problem.

As a result of R.F. induction type heating systems, subsequent development has been the radiation heating systems using a bank of lights which produce maximum radiant energy in a short wavelength range such as about 3 microns. Such radiation generally passes through the walls of the material from which the raction chamber is made. For this reason, quartz is generally most desirable and preferred as a reaction chamber material. Again, the amount of energy which needs to be used is on the order of about 150,000 watts per unit which approximates very closely the energy requirement in a typical R.F. heating unit.

Illustrative prior art is found such as in U.S. Pat. No. 3,796,182 or patents mentioned therein showing cool wall radiation heating systems and U.S. Pat. No. 3,603,284 showing R.F. heating units in various modifications thereof. Other illustrations of these reactors are found such as in U.S. Pat. Nos. 3,608,519 and 3,701,682.

As it can well be appreciated, a great number of variations and varients are found in these systems, but these are merely illustrative of the attempts in the prior art to solve the various, inherent problems in these prior art systems.

Another method used for vapor deposition from a gaseous phase is disclosed in U.S. Pat. No. 3,460,510 and is generally known as a resistance heater type coating unit. An illustration of this is an apparatus described in U.S. Pat. No. 3,865,072. The whole thrust of the last patent is to achieve equal distribution and decomposition of reactants so that no contaminations and improper mixing are experienced. The last patent also summarizes the prior art and illustrates the problems why minute amounts of contamination is an evil which must be acceptable in any of the above systems.

BRIEF DESCRIPTION OF THE INVENTION

It has now been found that when using the apparatus of the present invention not only great uniformity of the material sought to be deposited is achieved, but also power requirements are drastically reduced. Instead of requiring large and heavy duty air conditioning equipment to remove the radiant heat and R.F. induced heat, the heat input problem is drastically minimized and cooling can be achieved by merely circulating water through the system to easily dissipate heat through very innocuous means, such as cooling towers. It must be remembered that in a production unit with banks of units in use, the advantages increase with the number of units being used. Hence, potentially in large scale operations, the present apparatus improves production costs by several multiples. Thus, whereas in previous apparatuses 120 sq. in. of susceptor surface typically required a power input from about 50 kw to about 150 kw, the present apparatus requires only about 3 kw for an effective deposition area of 70 sq. in.

As it is evident from the illustration, the tremendous saving in the heat requirements makes the present invention that much more desirable.

Still further, as another aspect of the present invention, whereas in prior art R.F. chambers about 130 to 150 liters of hydrogen per minute are pumped through the system, according to the present method in the apparatus herein, only about 7 liters per minute need to be pumped to achieve the highly desirable uniformity obtainable herein.

Needless to say, as a result of these drastic reductions, both in power and in gas handling, the waste disposal associated with heat dissipation and hot gas handling, the venting problems which accompany many of these processes, the elimination of by-products, and the deposition efficiencies obtainable now make it possible to use vapor deposition technology where it heretofore could not have been used.

Accordingly, the low hydrogen and low silicon precursor consumption, the low scrubbing requirements, the low electricity use, and low air conditioning requirements all combine to allow the application of the epitaxial films technology to a great many uses heretofore foreclosed because of the high cost. Another feature is the unique ability to evacuate the system prior to deposition. This feature assures cleanliness of the system and the ability to detect any leaks. The vacuum feature can be extended so that the deposition process can be performed at reduced pressures.

BRIEF DESCRIPTION OF THE DRAWINGS

FIG. 1 is a frontal view of an apparatus, according to the present invention, used for achieving the above-mentioned advantages;

FIG. 2 is a cross-sectional view along line 2—2 of FIG. 1,

FIG. 3 is a sectional view along line 3—3 of FIG. 2 showing the interior plenum of the apparatus with parts broken away for clarity, FIG. 4 is a cross-sectional view taken along line 4—4 of FIG. 3.

DETAILED DESCRIPTION OF THE INVENTION AND PREFERRED EMBODIMENTS

Figure 5:
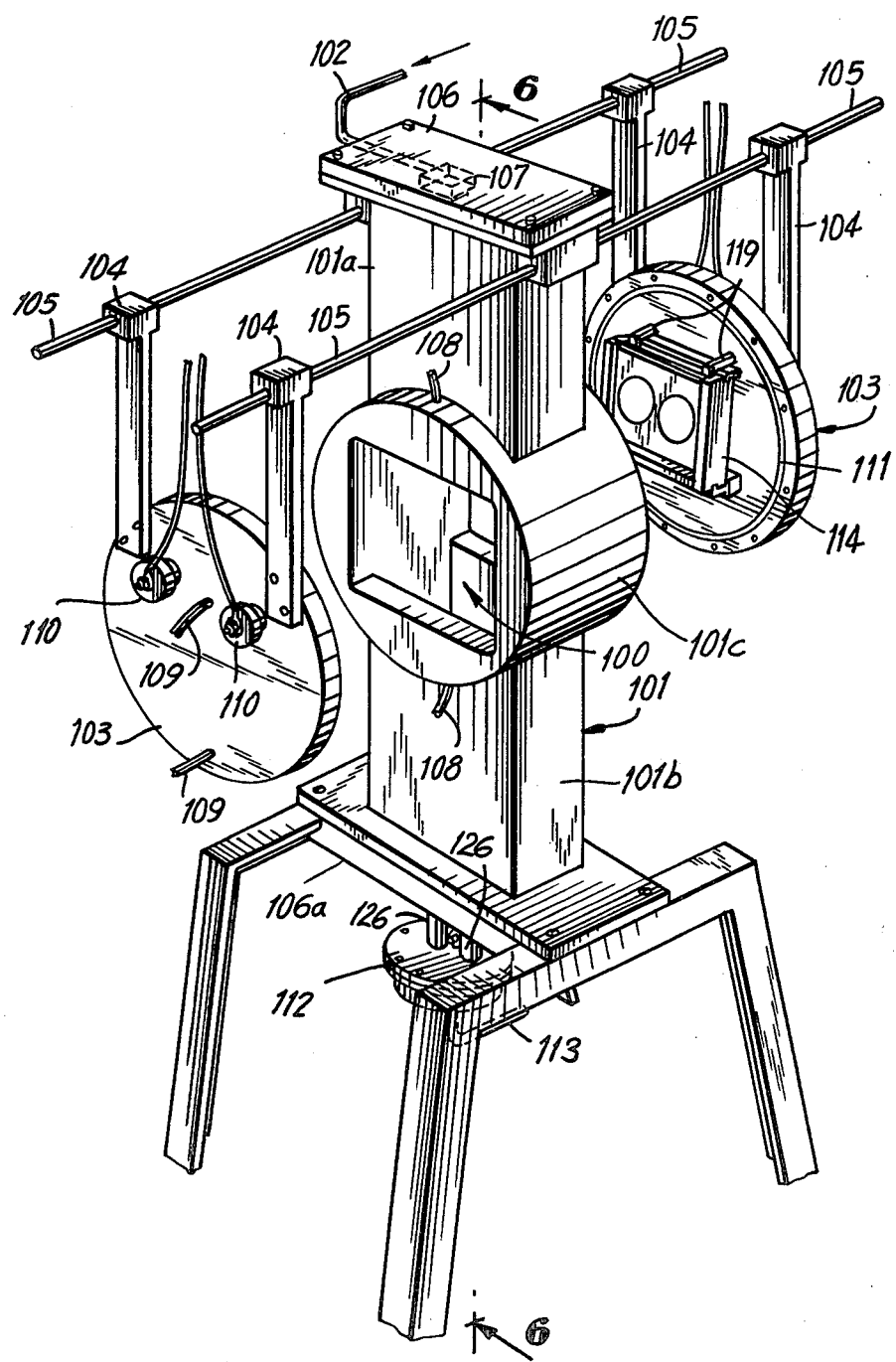
FIG. 5 is a perspective illustration of another embodiment of the present invention with some of the parts of the apparatus showing the position in which the apparatus is loaded prior to a reaction taking place therein.

Returning now to FIG. 1, a vapor deposition apparatus 11, according to one embodiment of the present invention, includes an inlet conduit 12 for introducing reactants and outlet conduits 14 and 16 for the removal of the same. An appropriate valve 21 on inlet conduit 12 controls the inlet rate of the reactants such as, for example, silicontetrachloride and hydrogen.

The apparatus 11 includes a pair of generally circular inner plates 15a positioned on opposite sides of an intermediate circular plate 37, which has a central polygonal opening 39 therein, thereby to define, with plates 15a, a reactor chamber 46 (FIG. 2). The inner plates 15a are inwardly recessed on the sides thereof opposite chamber 46, over a major portion of their area. These plates are then covered by external cover plates 15 and this entire assembly is bolted together by means of bolts 40 in any convenient manner. A thermocouple connection 26 is connected to a thermocouple 28 which measures the interior temperature of reactor chamber 46.

The exhaust conduits 14 and 16 are connected to a manifold 18 which, in turn, is connected through an appropriate valve 20 to a suitable vacuum device through conduit 24 to maintain reactor chamber 46 under a suitable vacuum. Conduit 22 leads to a suitable scrubber (not shown) in which the reactants are removed from the carrier gases; and valve 20 controls the flow to conduits 24 and 22. Generally, a vacuum of up to about $10^{-6}$ millimeters Hg can be maintained within reactor chamber 46 when valve 20 is turned to connect conduit 24 to manifold 18.

Plate 37 has a smaller diameter than inner cover plates 15a (See FIG. 2) and a pair of sealing rings 41 are positioned in radially spaced relation to each other about plate 37 between plates 15a to define therebetween a peripheral cooling passage 42. Cooling streams, of water or the like, are supplied to cooling passage 42 through conduits 32 to cool the interior plenum 46. The coolant from passage 42 is discharged from the apparatus through conduit 34. Additional coolant is supplied to the chambers 44, between plates 15a and cover plates 15, through supply conduits 36 and is discharged therefrom through conduits 38. The cooling chambers 44 are made water tight by the use of appropriate sealing means such as welding or O-rings (not shown) for enclosing the space between plates 15a and cover 15.

Heat is supplied to reaction chamber 46 via resistance element 52 through leads 30 which are held in place in the outer ring by vacuum tight electrically insulated bus bars 31.

Each of the inner cover plates 15a carry, on the interior surface thereof, a thin gold electroplated film 54 (FIG. 2) which is for the purpose of reflecting any heat generated by resistance element 52.

As seen in FIG. 2, a pair of susceptor plates 56 are positioned within chamber 46. The susceptors may be of silicon carbide and are mounted on a carrying frame 47 therefor. Frame 47 is formed of quartz, coated with $Si_3N_4$, and is generally rectangular in construction having top and bottom frame members 50 and side frame members 50a. The bottom frame member 50 of frame 47 has support pins 59 mounted thereon which include heads 59a. The lower edge of the susceptor plates 56 are supported on frame 47 on pins 59 between the bottom frame member 50 and the heads 59a of these pins while the top edge of the susceptor plates are held in place against the top frame element 50 by clips 53. The substrates on which a deposit is to be laid are illustrated as disks 58 supported on susceptors 56. In order to assure sufficient proximity to the susceptor 56, an appropriate spacer rod 57 is inserted between the festoon like resistance unit 52 shown in FIG. 3. The frame also serves as an insulator for the resistance unit 52.

An appropriate spacer means, such as the rods 51, are fused onto the rear of susceptor plates 53 to aid in holding these plates in place on the bottom frame member 50 of frame 47. The frame includes legs 49 formed on its opposite ends which are received in recessed slots 48 milled into the inner surface of the plate 37. This arrangement allows for easy insertion and removal of frame 47 together with the heating element 52.

As mentioned, susceptor plates have fused on retaining rods 51, also shown in FIG. 3, and small protruding bosses 62 for holding the substrate 58 (in the form of a disk) in place. The disks 58 are readily supported on the inclined susceptors 53 on small bosses 62 and can be easily removed therefrom. Thermocouple probe 60 is placed on one of the susceptor plates. In the event rectangularly shaped material is to be epitaxially coated, it can be held on similar appropriate rods or bosses inserted into the surface of the susceptor plates.

The reactant gases enter chamber 46 through conduit 12 and, because of the very close proximity to the side walls 15a and the gold plating 54 thereon, readily transit chamber 46 to exhaust conduits 14 and 16 with very uniform distribution of reactants and controlled decomposition of same.

With reference to FIG. 3, current leads 30 are connected to heat proof connectors 35 which are in turn connected to heating resistance element 52. As seen therein, the heating element has a continuous path from one end 52a to the other end 52b, respectively connected to connectors 35. Typically, the heating element can be a molybdenum sheet which is most resistant to the corrosive atmosphere and hydrogen embrittlement encountered within the reaction chamber. Other suitable heating resistance elements may be used. These are generally machined from a thin foil such as the molybdenum sheet, by appropriate means such as electrodischarge machining means, etc. Another type of resistance heating element also may be used, such as high temperature, resistant metal which is not susceptable to hydrogen embrittlement. Additional coating may be placed on the heating element, such as chromium carbide for protection against corrosion and providing increased emissivity.

Chromium carbide may be deposited on the heating units by appropriate coating methods. The slice holder or susceptor 58 may also be of a metal in which event it is coated such as with silicon nitride or silicon dioxide.

Typically, the heating resistance unit is about 5 inches high and 7 inches long. In order to remove any silicon which may have been deposited, an etch solution of nitric acid and hydrogen fluoride may be used on the susceptor plates. Typically, the reactor 11 is made of stainless steel, but any other high temperature material may be used. The requirement is that the material resists corrosion occuring within the plenum such as caused by HCl or decomposition products of silicon halides.

The deposited silicon epitaxial film generally may be from very slight amounts to about 10 mils with the thicker deposits being self-supporting. An etchant may be used to remove the backing and to make a self-supporting sheet of silicon which subsequently may be annealed to remove deposition process generated strains associated therewith. Either strain anneal method can be used or gradiant anneal method.

Another embodiment of the invention is illustrated in FIG. 5 which includes a central reaction chamber 100 located within a chimney 101 having a central housing portion 101c and top and bottom portions 101a and 101b, respectively, for leading gas from an inlet conduit 102 into the chamber 100 and for evacuating gas from the reaction chamber. Cover plates 103 are provided on the opposite open sides of reaction chamber 100. These plates are movably suspended by arms 104 from rods 105 for ease of closing and opening of the reaction chamber 100. A top cover plate 106 closes the top portion 101a of chimney 101 and has a built in quartz window 107, allowing for visual monitoring of the reaction taking place in chamber 100. A bottom cover plate 106a closes the bottom portion of chimney 101, but permits discharge of the reaction gases via collection chamber 112 and an appropriate conduit 113 issuing therefrom.

Figure 6:
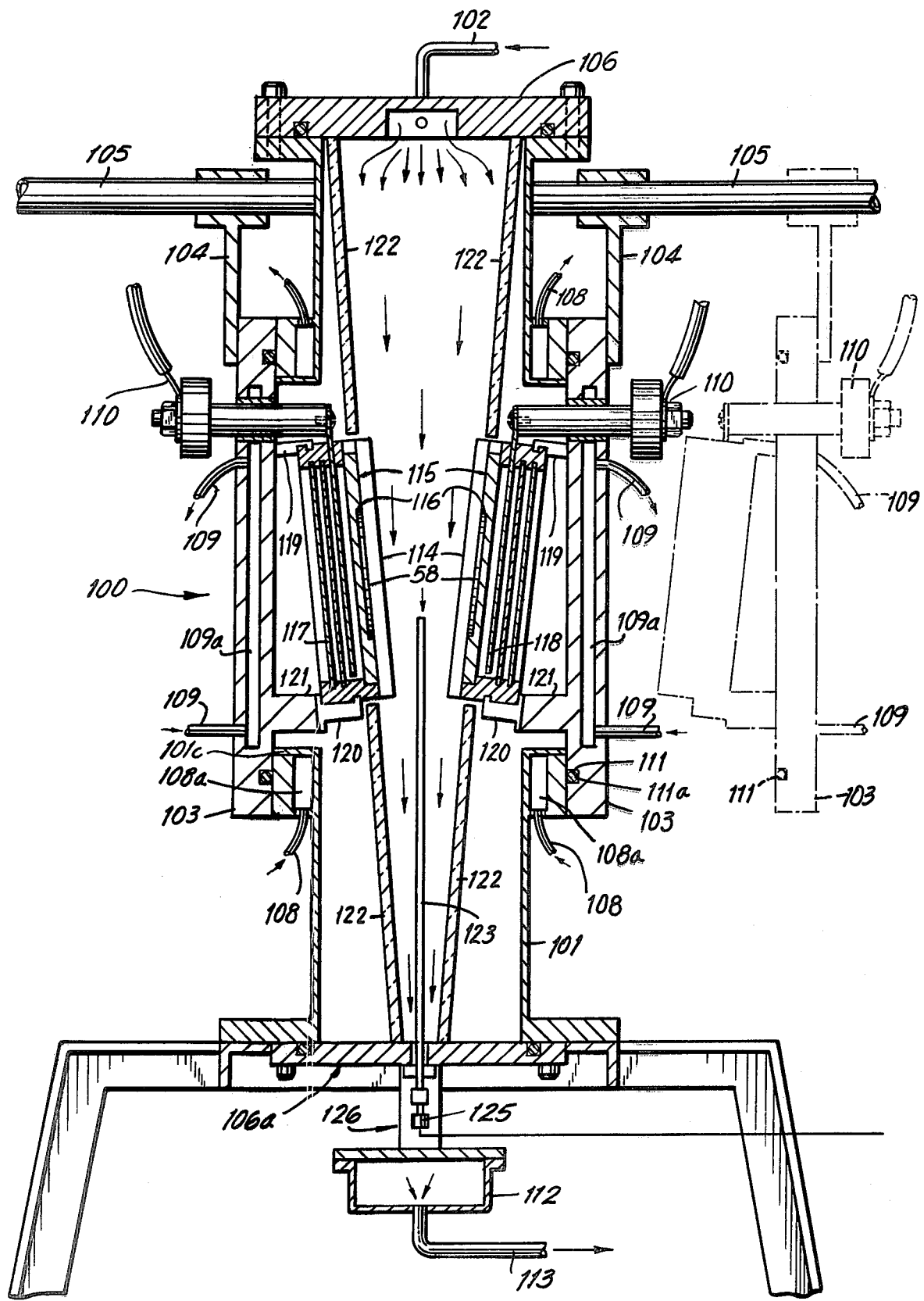
FIG. 6 is a cross-sectional view taken along line 6—6 of FIG. 5.

Cooling medium conduits 108 are provided for both sides of the reaction chamber (shown only for one side in FIG. 5) through which coolant is supplied to the annular cooling chambers 108a formed in the chamber 100 (see FIG. 6). Similarly, cooling medium conduits 109 for supplying coolant to cooling chambers 109a in cover plates 103 are provided. Connectors 110 for electrical current are mounted on the cover plates 103 and protrude into the reaction chamber 100 as seen in FIG. 6. Each cover plate has an inner groove 111 formed therein (as shown on the inside right-hand cover plate 103 in FIG. 5) to accommodate a sealing means, such as an O-ring 111a.

As shown for the right-hand side cover plate in FIG. 5, a susceptor plate carrying frame 114 is mounted on each cover plate 103, on the inside thereof. A corresponding susceptor plate carrying frame is mounted on the left-hand cover plate 103.

FIG. 6 illustrates the configuration of the apparatus with cover plates 103 closed against chamber 100. These plates may be slideably or threadedly engaged with rods 105 so that rotation of the rods will move plates towards and away from chamber 100. An open position for one of the cover plates is shown by the phantom lines in FIG. 6. The cover plates 103 are bolted in place after closure.

The susceptor plate carrying frame 114 is of the same material as described in connection with frame 47 in FIG. 2. Susceptor plates 115 are also formed of the same material as for susceptor plates 56 in FIG. 2. Substrate disks 58 have, however, a recess 116 formed therein for receiving and supporting a substrate wafer disks. Thus, the substrate need not be supported by pins or bars as shown in FIG. 2.

Each of the susceptor plate carrying frames 114 also has two reflectors 117 behind the resistance elements 118. The last are of the same construction as the resistance elements 52 described in connection with FIG. 2 and they are electrically connected, as shown in FIG. 6 to the connectors 110. It has been found that an additional reflector plate 117 increases the efficiency of the apparatus. These plates may be of an appropriate heat resistant material overplated with a metal such as gold to enhance the reflection of heat from the resistance element.

Susceptor plate carrying frame 114 is held by fingers 119 attached directly to the cover plate 103 and/or fingers 120 attached to extensions 121 protruding from the cover plate 103.

Appropriate quartz walls 122 are attached to the top and bottom portions of the chimney cover plates 106 and 106a, respectively. These walls provide a confined flow path for the active gases which exit via collection chamber 112 from chimney 101. Gases can be fed from the bottom by reversing the flow.

As shown in FIG. 6, a thermocouple 123 is provided for measuring the temperature within the reaction chamber. The thermocouple connector 125 is inserted in the bottom plate 106a. Two short conduits 126 connect the reaction chamber to evacuation chamber 112.

Again, the apparatus shown in FIGS. 5 and 6 may be operated in a similar manner as the apparatus shown and described in connection with FIGS. 1 to 4 and can employ the same materials as described as suitable for that apparatus.

As it is evident from the above, the apparatus and method which has been disclosed allows an easy and rapid production of epitaxial crystals useful, such as in the semi conductor industry and other industries.

Inasmuch as the cost reduction achievable by the present reactor allows for drastically increased efficiency such as 95% when based on power consumption alone, it is readily evident that the present process opens up new areas for use where heretofore silicon based deposits such as silicon solar energy panels heretofore could not be used.

As an example of a typical run, the following settings have been used:

Hydrogen flow = 10 liters/min.
Triclorosilane flow = 0.100 liters/min.
Temperature of substrate = 1100° C.
Growth rate = 1 micon/min.

What is claimed is:

1. Apparatus for performing vapor deposition processes on a substrate, comprising a central housing having a centrally located reaction chamber formed therein, said housing having a pair of opposed openings in opposed sides thereof, cover plate means removably secured to said housing for closing said opening, said cover plate means defining coolant chambers therein; means for supplying and exhausting reaction gases from the reaction chamber; said housing including means for defining at least one additional coolant chamber therein about a portion of the periphery of the reaction chamber between said cover plate means; means for supplying and exhausting coolant to and from said coolant chambers; support means in said reaction chamber for supporting a substrate thereon upon which vapor deposition is to occur; and means for supplying heat in said reaction chamber on the side of said support means opposite said substrate to heat the substrate.

2. Apparatus for use in performing vapor deposition processes on a substrate, comprising a hollow chimney having a centrally located reaction chamber formed therein, said chimney having a pair of opposed openings formed in the sides thereof at said reaction chamber; a pair of hollow cover plates removably secured to said chimney for closing said openings, said cover plates having cooling chambers formed therein; first conduit means operatively connected to said cooling chambers for supplying and exhausting cooling fluid to and from said cooling chambers; support means in said reactor chamber for supporting a substrate thereon upon which said vapor deposition is to occur, and means for supplying and exhausting reaction gases to and from said chimney.

3. Apparatus as defined in claim 2 wherein said chimney has a pair of generally annular cooling chambers formed therein respectively surrounding said chimney openings, and second conduit means operatively connected to said chimney cooling chambers for supplying and exhausting cooling fluid to and from said chimney cooling chambers.

4. Apparatus as defined in claim 3 including means for slideably mounting said cover plates on said chimney for movement towards and away from said chimney openings.

5. Apparatus as defined in claim 3 wherein said substrate support means is mounted on at least one of said cover plates on the side thereof facing its associated chimney opening.

6. Apparatus as defined in claim 5 including separate oppositely facing walls in said chimney inclined downwardly and towards each other within said chimney for defining a confined flow path for reaction gases through the chimney and reaction chamber.

* * * * *